United States Patent
He et al.

[11] Patent Number: 6,146,973
[45] Date of Patent: Nov. 14, 2000

[54] HIGH DENSITY ISOLATION USING AN IMPLANT AS A POLISH STOP

[75] Inventors: Yue Song He; Yowjuang William Liu, both of San Jose, Calif.

[73] Assignee: Advanced Micro Devices, Inc., Sunnyvale, Calif.

[21] Appl. No.: 09/289,669

[22] Filed: Apr. 12, 1999

Related U.S. Application Data

[62] Division of application No. 08/989,822, Dec. 12, 1997, abandoned.

[51] Int. Cl.[7] .................................................. H01L 21/76
[52] U.S. Cl. ............................................. 438/433; 438/407
[58] Field of Search .............................. 438/424, 435, 438/511, 520, 524, 433–4, 407; 216/2, 27, 47

[56] References Cited

U.S. PATENT DOCUMENTS

| | | | |
|---|---|---|---|
| 4,290,831 | 9/1981 | Ports et al. | 438/404 |
| 4,944,836 | 7/1990 | Beyer et al. | 156/645 |
| 4,957,592 | 9/1990 | O'Neill | 216/2 |
| 5,084,071 | 1/1992 | Nenadic et al. | 51/309 |
| 5,168,343 | 12/1992 | Sakamoto | 257/513 |
| 5,183,767 | 2/1993 | Baratte et al. | 438/420 |
| 5,674,784 | 10/1997 | Jang et al. | 438/692 |
| 5,830,773 | 11/1998 | Brennan et al. | 438/699 |
| 5,902,127 | 5/1999 | Park | 438/435 |

*Primary Examiner*—Olik Chaudhuri
*Assistant Examiner*—Anh Duy Mai
*Attorney, Agent, or Firm*—Foley & Lardner

[57] ABSTRACT

A process for forming high density isolation for very large scale integration on semiconductor chips, comprising the steps of: orientation-dependent etching a portion of a semiconductor substrate to form protruding features on a surface of the semiconductor substrate; forming a layer of insulation above the etched portion of the semiconductor substrate; implanting atoms and/or ions of a non-conductive material to a first predetermined depth into the insulation layer and a second predetermined depth into the protruding features in the semiconductor substrate to provide a detectible change in material characteristic at that depth; and polishing the insulation layer and protruding features down to a depth determined by detecting the change in material characteristic to thereby remove a top portion of the protruding features to form a first surface on each of a plurality of the protruding features.

27 Claims, 1 Drawing Sheet

HIGH DENSITY ISOLATION USING AN IMPLANT AS A POLISH STOP

This application is a divisional of application Ser. No. 08/989,822, filed Dec. 12, 1997 now abandoned.

BACKGROUND OF THE INVENTION

The present invention relates generally to methods for forming integrated circuit chips, and more particularly, to a method for creating a high density isolation trench by means of an orientation-dependent etch and for precisely controlling a depth of polishing on the resulting textured surface.

An integrated circuit chip comprises an array of devices formed in a semiconductor substrate, with the contacts for these devices interconnected by patterns of conductive wires. An important aspect of the processing of integrated circuit chips entails the formation of isolation regions around active regions where active devices such as transistors will be formed. The formation of such isolation regions can be a complicated process involving one or more masking steps A particular problem in such processes arises in the various polishing steps utilized in the processing of integrated circuit chips. This problem arises because it is very difficult to precisely determine to within a few angstroms when a desired depth has been reached by the polishing process.

SUMMARY OF THE INVENTION

The present invention comprises a process for forming high density isolation regions for very large scale integration on semiconductor chips, comprising the steps of: orientation-dependent etching a portion of a semiconductor substrate to form protruding features on a surface of the semiconductor substrate; forming a layer of insulation above the orientation-dependent etched portion of the semiconductor substrate; implanting atoms and/or ions of a material to a first pre determined depth into the insulation layer and to a second predetermined depth into the protruding features in the semiconductor substrate to provide a detectable change in material characteristic at that depth; and polishing the insulation layer and protruding features down to a depth determined by detecting the change in material characteristic to thereby remove a top portion of the protruding features to form a first surface on each of a plurality of the protruding features.

In a preferred embodiment of the present invention, the detected material characteristic is material hardness or material etch rate.

In a yet further aspect of the preferred inventive process, the implanting step comprises the step of implanting with either Si, or O, or N atoms and/or ions.

In a preferred embodiment of the present inventive process, the orientation-dependent etching step forms pyramid-shaped protruding features.

In a yet further aspect of the preferred embodiment, the orientation-dependent etching step comprises orientation-dependent etching a silicon substrate with a predetermined lattice orientation of [111], and wherein the insulation forming step comprises the step of forming a layer of oxide.

In a yet further aspect of the preferred embodiment, the polishing step comprises chemical-mechanical polishing.

DETAILED DESCRIPTION OF THE PREFERRED EMBODIMENTS

Figure 1:
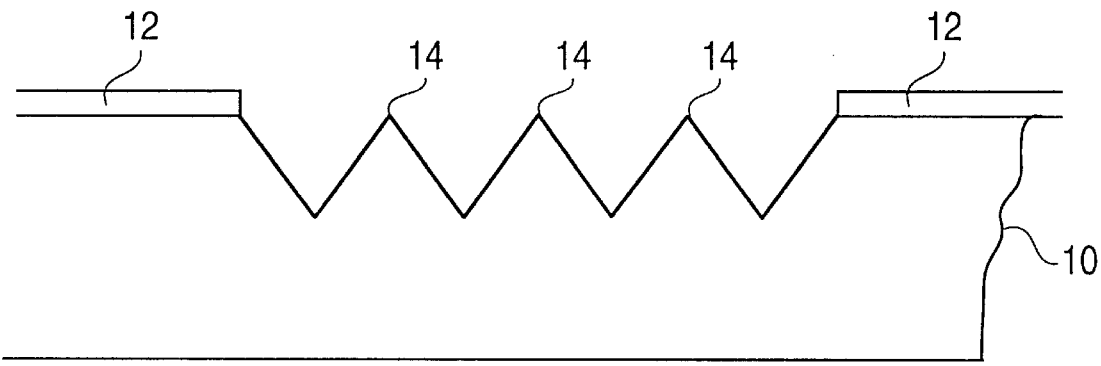
FIG. 1 is a schematic side view of a semiconductor substrate after orientation-dependent etching.

Referring now to the drawings, these drawings are provided to illustrate one exemplary implementation of the present invention, and are not intended to be limiting in their scope. Additionally, it should be noted that these drawings are illustrative in nature and thus, are not drawn to scale. Moreover, various well-known process and clean steps have not been recited in the present description in order to properly focus the disclosure on the invention.

Referring now to FIG. 1, there is shown a semiconductor substrate 10 which, in an exemplary embodiment, comprises a silicon substrate. By way of example, this silicon substrate 10 may comprise single crystal P-type silicon with an orientation which facilitates orientation-dependent etching. By way of example, this lattice orientation may be [111]. A mask layer 12 may be formed to define areas to be etched in subsequent process steps. This mask layer may be formed by means of standard lithography and etching techniques which are well-known in the art.

Following the formation of the mask 12, an orientation-dependent etching step is performed in the areas not covered by the mask 12 to form protruding features 14 on the surface of the semiconductor substrate 10. By way of example, and not by way of limitation, for a [111] lattice a 30–50% solution of KOH may be utilized to define the protruding features 14 on the semiconductor substrate 10. KOH etches much faster along the [110] plane as compared to other planes to yield the desired protruding features. Generally, these protruding features will be in the shape of pyramids 14. It should be noted that if a semiconductor substrate with a different lattice orientation is utilized which is susceptible to orientation-dependent etching, then a different etching solution may be required.

Figure 2:
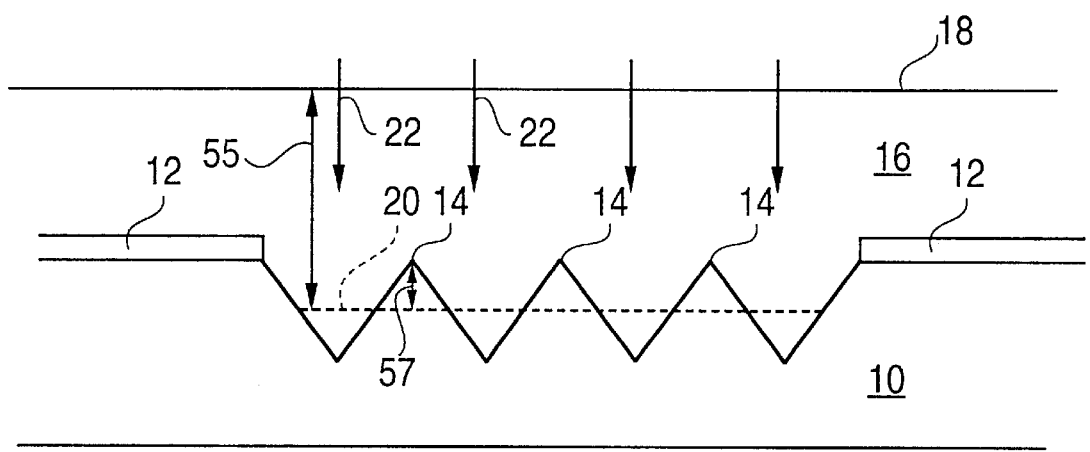
FIG. 2 is a schematic side view of the substrate of FIG. 1 after an insulation forming step and an implant step.

Referring now to FIG. 2, the substrate of FIG. 1 is shown after the formation of an insulation layer 16 thereover and an implant step. In the present exemplary embodiment, using a silicon substrate 10, the insulator layer 16 may comprise an oxide layer. By way of example, but not by way of limitation, this oxide layer 16 may be formed by means of a CVD deposition. Such CVD depositions typically are performed in a temperature range of 400°–800° C. After the formation of this insulator layer 16, layer 16 is then planarized using standard techniques. By way of example, the planarization of the oxide layer 16 may be accomplished by means of a chemical-mechanical polishing step (to be discussed below) to yield a substantially planar surface 18.

An essential purpose of this type of processing is to polish down to a predetermined level 20 to thereby remove a top portion of the protruding features 14 to leave mesas of semiconductor where active devices will be formed, surrounded by an insulator. Because of the very small dimensions involved, this planarization or polishing step is very difficult to control. The present invention has solved this planarization/polishing depth control problem by means of implanting atoms or ions of a non-conductive material down to the predetermined level 20. This implant is illustrated by means of the arrows 22. It can be seen that the level or depth 20 comprises a first predetermined depth 55 from the surface 18 down through the insulator layer 16 to the level 20, and a second predetermined depth 57 from the top of the protruding feature 14 to the level 20. The purpose of the atom and/or ion implant is to provide a detectable change in a material characteristic which characteristic may be monitored and used to control a polishing process.

In a preferred embodiment, atoms and/or ions bombard the insulator surface and penetrate down to the predetermined level in accordance with their implant energy. This implant energy may be controlled to set the desired depth of implant. The result of implanting this non-conductive material is that it changes a material characteristic in the insulator layer 16 and the top portion of the protruding features 14 down to the level 20, which material characteristic is detectable. By way of example, Si or O or N atoms and/or ions may be implanted into the oxide insulator layer 16 and the silicon features 14. These particular elements have been found to be advantageous for implanting because they are heavier than many other elements and create a clear change in the hardness characteristic and/or etch rate of the material in the implantation region which hardness characteristic and/or etch rate is clearly detectable during polishing.

Specifically, it is believed that the implanting of Si or O atoms and/or ions into the oxide layer 16 and the semiconductor features 14 converts (either by mechanical damage to the lattice or due to lattice mismatch in the case of O) the crystalline structure of the respective materials to an amorphous (softer) state, thereby clearly changing the hardness characteristic of the material in the implant region. This change in the hardness characteristic as a polisher reaches the end of the implanted amorphous region is detectable, as is well-known in the art. Likewise, a change from an amorphous state to a crystalline structure also changes the etch rate characteristic of the material, which etch rate change is clearly detectable.

When N atoms and/or ions are used as the implant material, the implant step is followed by a high temperature anneal step, by way of example, an anneal in the range of 1000° C. The annealing step causes the formation of a layer of SiN in the silicon features 14 at the dashed line 20. When the SiN layer is reached, the etch rate for chemical-mechanical polishing drops significantly. This change in etch rate is detectible by well known means and may be used to stop the polishing process.

Figure 3:
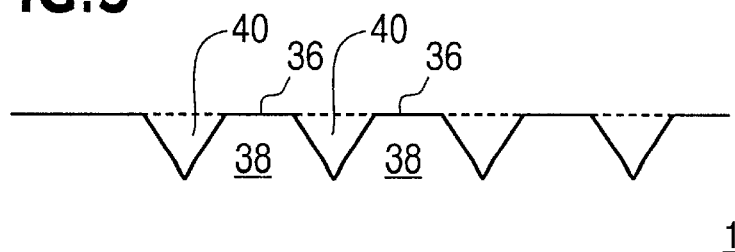
FIG. 3. is a schematic side view of the substrate of FIG. 2 after a polishing step.

Referring now to FIG. 3, the substrate of FIG. 2 is shown after the performance of a polishing step. In a preferred embodiment, this polishing step may be implemented by means of chemical-mechanical polishing. Chemical-mechanical (CMP) polishing processes employ both a chemical and a mechanical component. A rotating or vibrating disk or pad is moved relative to the semiconductor wafer surface in the presence of a chemical-mechanical polishing slurry. This CMP slurry includes suspended solids as well as a chemical solution component which attacks the material being polished. The two processes in combination etch the upper layer of a wafer by chemical and mechanical action which removes high points much faster than the low points on the wafer surface. Typical chemical-mechanical polishing methods and slurries are disclosed in U.S. Pat. Nos. 4,944,836 and 5,084,071. The slurry particles utilized in these slurries are typically silica or alumina. The result of this chemical-mechanical polishing process is a substantially flattened upper surface. Typical chemical-mechanical polishing processes include a hardness monitor and/or an etch rate detector which will detect and provide a clear indication when the hardness characteristic and/or the etch rate characteristic of the oxide layer and the silicon layer change at the point when the end of the implant region is reached. This polishing step can achieve a predetermined uniform depth to within a few angstroms across the surface of the device.

It should be noted that typically there is some damage in the top surface 36 of the mesas 38 that have now been formed in the silicon substrate 10. This damaged silicon may be removed by a standard etching process. By way of example, but not by way of limitation, for a silicon substrate a chlorine hydroxide 3–5% solution may be utilized to remove the damaged silicon selectively while having very little effect on the oxide regions 40 surrounding each of the mesas 38. This proposed etching solution removes material at about 150 Å per minute. Typically 100–500 Å are removed depending on the amount of damage present in the silicon. Very fresh silicon results from this process for use in forming the active regions of devices.

It should be noted that a residual amount of implanted Si, O, or N remains in the oxide regions 40 between the mesas 40 in the finished device. The amount of Si, O, or N is detectable, but is not enough to change the character of the oxide.

It can be seen that the present invention provides a novel way of forming a very high density number of semiconductor mesas where active devices may be formed surrounded by insulated trenches without using a mask over each individual mesa surface 36.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A process for forming high density isolation for very large scale integration on semiconductor chips, comprising the steps of:

orientation-dependent etching a portion of a semiconductor substrate to form protruding features on a surface of said semiconductor substrate;

forming a layer of insulation above said etched portion of said semiconductor substrate;

implanting atoms and/or ions of a non-conductive material to a first predetermined depth into said insulation layer, with respect to a top-most location of said insulation layer, and a second predetermined depth into said protruding features, with respect to a topmost location of said protruding features, to provide a detectable change in material characteristic at said first and second predetermined depths; and polishing said insulation layer and protruding features down in an amount corresponding to at most said first and second predetermined depths, respectively, as determined by detecting said change in material characteristic, to thereby remove a top portion of said protruding features to form a first surface on each of a plurality of said protruding features.

2. A process as defined in claim 1, wherein said detected material characteristic is hardness.

3. A process as defined in claim 1, wherein said detected material characteristic is material etch rate.

4. A process as defined in claim 1, wherein said implanting step comprises the step of implanting with Si atoms and/or ions.

5. A process as defined in claim 2, wherein said implanting step comprises the step of implanting with Si atoms and/or ions.

6. A process as defined in claim 3, wherein said implanting step comprises the step of implanting with Si atoms and/or ions.

7. A process as defined in claim 1, wherein said implanting step comprises the step of implanting with O atoms and/or ions.

8. A process as defined in claim 2, wherein said implanting step comprises the step of implanting with O atoms and/or ions.

9. A process as defined in claim 3, wherein said implanting step comprises the step of implanting with O atoms and/or ions.

10. A process as defined in claim 1, wherein said implanting step comprises the step of implanting with N atoms and/or ions.

11. A process as defined in claim 3, wherein said implanting step comprises the step of implanting with N atoms and/or ions.

12. A process as defined in claim 1, wherein said orientation-dependent etching step forms approximate pyramid-shaped protruding features.

13. A process as defined in claim 2, wherein said orientation-dependent etching step comprises orientation dependent etching a silicon substrate with a predetermined lattice orientation, and wherein said insulation forming step comprises the step of forming a layer of oxide.

14. A process as defined in claim 1, wherein said polishing step comprises a chemical-mechanical polishing step.

15. A process as defined in claim 1, further comprising the step of:
   etching said top surface of said protruding features.

16. A process for forming high density isolation for very large scale integration on a semiconductor chip, comprising the steps of:
   orientation-dependent etching a portion of a silicon substrate with a [111] orientation to form a plurality of pyramid-shaped features on a surface of said silicon substrate;
   forming an oxide layer over said portion of pyramid-shaped features;
   implanting Si atoms and/or ions of a non-conductive material to a first predetermined depth into said oxide layer, with respect to a top-most location of said oxide layer, and a second predetermined depth into said pyramid-shaped features, with respect to a top-most point of said pyramid-shaped features, to provide a detectable change in material characteristic at said first and second predetermined depths; and
   chemical-mechanical polishing said oxide layer and pyramid-shaped features down in an amount corresponding to at most said first and second predetermined depths, respectively, as determined by detecting said change in material characteristic, to thereby remove a top portion of said pyramid-shaped features.

17. A process as defined in claim 16, wherein said chemical-mechanical polishing step comprises the step of polishing to a depth determined by detecting a change in material hardness.

18. A process as defined in claim 16, wherein said chemical-mechanical polishing step comprises the step of polishing to a depth determined by detecting a change in material etch rate.

19. A process for forming high density isolation for very large scale integration on a semiconductor chip, comprising the steps of:
   orientation-dependent etching a portion of a silicon substrate with a [111] orientation to form a plurality of pyramid-shaped features on a surface of said silicon substrate;
   forming an oxide layer over said portion of pyramid-shaped features;
   implanting O atoms and/or ions of a non-conductive material to a first predetermined depth into said oxide layer, with respect to a top-most location of said oxide layer, and a second predetermined depth into said pyramid-shaped features, with respect to a top-most point of said pyramid-shaped features, to provide a detectable change in material characteristic at said first and second predetermined depths; and
   chemical-mechanical polishing said oxide layer and pyramid-shaped features down in an amount corresponding to at most said first and second predetermined depths, respectively, as determined by detecting said change in material characteristic, to thereby remove a top portion of said pyramid-shaped features.

20. A process as defined in claim 19, wherein said chemical-mechanical polishing step comprises the step of polishing to a depth determined by detecting a change in material hardness.

21. A process as defined in claim 19, wherein said chemical-mechanical polishing step comprises the step of polishing to a depth determined by detecting a change in material etch rate.

22. A process for forming high density isolation for very large scale integration on a semiconductor chip, comprising the steps of:
   orientation-dependent etching a portion of a silicon substrate with a [111] orientation to form a plurality of pyramid-shaped features on a surface of said silicon substrate;
   forming an oxide layer over said portion of pyramid-shaped features;
   implanting N atoms and/or ions of a non-conductive material to a first predetermined depth into said oxide layer with respect to a top-most location of said oxide layer, and a second predetermined depth into said pyramid-shaped features, with respect to a top-most point of said pyramid-shaped features, to provide a detectable change in material characteristic at said first and second predetermined depths; and
   chemical-mechanical polishing said oxide layer and pyramid-shaped features down in an amount corresponding to at most said first and second predetermined depths, respectively, as determined by detecting said change in material characteristic, to thereby remove a top portion of said pyramid-shaped features.

23. A process as defined in claim 22, wherein said chemical-mechanical polishing step comprises the step of polishing to a depth determined by detecting a change in material etch rate.

24. A process for forming high density isolation for very large scale integration semiconductor chips, comprising the steps of:
   forming protruding features on a surface of said semiconductor substrate;
   forming a layer of insulation above said etched portion of said semiconductor substrate;
   implanting atoms and/or ions of a non-conductive material to a first predetermined depth into said insulation layer with respect to a top-most location of said insulation layer, and a second predetermined depth into said protruding features, with respect to a top-most location of said protruding features to provide a detectable change in material characteristic at said first and second predetermined depths; and polishing said insulation layer and protruding features down in an amount corresponding to at most said first and second predetermined depths, respectively, as determined by detecting said change in material characteristic, to thereby remove a top portion of said protruding features to form a first surface on each of a plurality of said protruding features.

25. A process as defined in claim 24, wherein said implanting step comprises the step of implanting from the group of Si, O, and N.

26. A process as defined in claim 24 wherein said detected material characteristic is hardness.

27. A process as defined in claim 24, wherein said detected material characteristic is etch rate.

* * * * *